United States Patent [19]

Bottomley et al.

[11] Patent Number: 4,641,097

[45] Date of Patent: Feb. 3, 1987

[54] ELLIPTICAL CROSS-SECTION SLOTTED-TUBE RADIO-FREQUENCY RESONATOR FOR NUCLEAR MAGNETIC RESONANCE IMAGING

[75] Inventors: Paul A. Bottomley, Clifton Park; John F. Schenck, Schenectady, both of N.Y.

[73] Assignee: General Electrtic Company, Schenectady, N.Y.

[21] Appl. No.: 609,043

[22] Filed: May 10, 1984

[51] Int. Cl.$^4$ .............................................. G01R 33/20
[52] U.S. Cl. ..................................... 324/318; 324/322
[58] Field of Search ............... 324/300, 307, 315, 316, 324/318, 322

[56] References Cited

U.S. PATENT DOCUMENTS

| | | | |
|---|---|---|---|
| 4,398,149 | 8/1983 | Zens | 324/316 |
| 4,435,680 | 3/1984 | Froncisz | 324/315 |
| 4,480,239 | 10/1984 | Hyde | 324/315 |
| 4,517,516 | 5/1985 | Hill | 324/318 |

OTHER PUBLICATIONS

M. Mehting et al, "A Slotted Tube Resonator STR for Pulsed ESR and ODMR Experiments", J. Phys. E Sci. Instrum., vol. 13, No. 8, Aug., (1980), pp. 117, 118.
"An Efficient Decoupler Coil Design which Reduces Heating in Conductive Samples in Superconducting Spectrometers", D. W. Alderman et al., *Journal of Magnetic Resonance*, vol. 36, pp. 447-451, (1979).
"The Sensitivity of the Zeugmatographic Experiment Involving Human Samples", D. I. Hoult et al., *Journal of Magnetic Resonance*, vol. 34, pp. 425-433, (1979).
"Radio Frequency Coil Technology in NMR Scanning", D. I. Hoult, *Proc. Internat. Symp. on NMR Imaging*, (1982), pp. 33-39.

*Primary Examiner*—Michael J. Tokar
*Attorney, Agent, or Firm*—Geoffrey H. Kraus; James C. Davis, Jr.; Marvin Snyder

[57] ABSTRACT

A radio-frequency coil, for nuclear magnetic resonance imaging at Larmor frequencies associated with a magnetic field of greater than about 0.5 Tesla, comprises a slotted-tube radio-frequency resonator having an elliptical cross-section. First and second complementary outer resonator portions have central bands connecting juxtaposed wing structures; the end of each of the four wings is spaced from a complementary wing portion of the other outer portion and capacitively coupled thereto. An inner structure has a pair of elliptical guard rings placed substantially in registration with the elliptical portions of the outer structure wing portions. The eccentricity ratio of the elliptical cross-section of the resonator and the resonator dimensions are arranged to provide an interior volume into which a human head or body extremity can be placed for imaging purposes.

21 Claims, 11 Drawing Figures

ELLIPTICAL CROSS-SECTION SLOTTED-TUBE RADIO-FREQUENCY RESONATOR FOR NUCLEAR MAGNETIC RESONANCE IMAGING

BACKGROUND OF THE INVENTION

The present application relates to nuclear magnetic resonance (NMR) imaging and, more particularly, to a novel slotted-tube radio-frequency (RF) resonator having an elliptical cross-section, for use in obtaining NMR images in a NMR imaging system.

There has hitherto been wide speculation in NMR publications (such as "Radio Frequency Coil Technology In NMR Scanning", D. Hoult, Proc. Internat. Symp. on NMR Imaging (1982), pages 33–39; "NMR Imaging and Biomedicine", P. Mansfield et al., *Academic Press* (1982), pages 174–187; "Positron Tomography and Nuclear Magnetic Resonance Imaging", G. Brownel et al., *Science,* (1982) issue 215, pages 619–626; "NMR Imaging in Medicine", I. Pykett, *Scientific American* (1982) issue 246, pages 78–88; and other publications) that hydrogen head and/or body imaging would be unfeasible in a static NMR imaging field of magnitude much above about 0.5 Tesla (T), at least in part due to the problem of providing suitable NMR imaging coils at the Larmor frequencies, typically in the range from about 20 MHz. to about 100 MHz., associated with the greater static field magnitudes. It is well known that conventional "half turn" saddle coil, Helmholtz and solenoidal geometries are generally unsuited and precluded for head and body-sized NMR imaging coils at frequencies above about 30 MHz. due to their self-resonant properties, and thus would be unusable at the approximately 64 MHz. imaging frequency for $^1$H resonance in an imaging system utilizing a static field of about 1.5 T magnitude.

A slotted-tube resonator has been used at an even higher frequency of 300 MHz., for small-sample $^1$H NMR analysis, but this resonator (described by D. Alderman et al., in "An Efficient Decoupler Coil Design which Reduces Heating in Conductive Samples in Super Conducting Spectrometers", Volume 36, J. of Mag. Resonance, pp. 447–451, 1979), has such a small working volume diameter (e.g. about 0.72") as to preclude access of the human head, extremities and/or torso therein for imaging purposes.

It is also well known that the frequency dependence of the signal-to-noise ratio (S/N) in an NMR imaging system in which system noise contributions and dielectric losses in the sample have been minimized, is given by the formula:

$$(S/N) \alpha F^2/(aR_c^2 F^{\frac{1}{2}} + bF^2 R_s^5)^{\frac{1}{2}}$$

where $R_c$ and $R_s$ are the respective coil and sample radii, a and b are constants and F is the Larmor (NMR) frequency of the sample in the particular magnetic field magnitude utilized. The $F^2$ term in the numerator reflects the frequency dependence of the NMR imaging return signal, while the two terms in the denominator represent noise contributions respectively due to coil losses and inductive losses in the sample. The coil loss noise-inducing term $(aR_c^2 F^{\frac{1}{2}})$ can be considered optimal when its noise contribution is insignificant compared to the inductive losses in the body sample being imaged. In an experiment utilizing a typical saddle coil for head imaging at about 5 MHz., the observed losses in the imaged object, e.g. the patient's head, were only about 0.4 times the coil losses. Thus, the coil noise contribution in this experiment is not insignificant compared to the body loss contribution and coil noise cannot be considered optimized.

Accordingly, it is desirable to provide a radio-frequency coil for NMR imaging which will not only be capable of operation at the Larmor frequencies (between about 20 MHz. to about 100 MHz.) associated with static magnetic fields of magnitude greater than about 0.5 Tesla, but will also have a relatively insignificant loss contribution compared to the losses introduced by the object being imaged. The ratio of the RF coil quality Q factor measured with the NMR coil substantially filled or loaded by the body ($Q_L$) can be compared to the Q factor measured with the coil empty or unloaded ($Q_U$) and is a measure of the relative noise contribution from the RF coil. Therefore, a high $Q_U Q_L$ ratio is most desirable to optimize the signal-to-noise ratio for NMR imaging.

BRIEF SUMMARY OF THE INVENTION

In accordance with the invention, a radio-frequency coil, for nuclear magnetic resonance imaging at Larmor frequencies associated with a static magnetic field of magnitude greater than about 0.5 Tesla, comprises a slotted-tube radio-frequency resonator having an elliptical cross-section. The resonator contains first and second complementary outer structure portions having relatively wide bands connecting juxtaposed wing structures, with the end of each of the four wings (leftwardly and rightwardly arranged respectively at the top and bottom of each outer structure portion band) being spaced from a complementary one of the wing portions of the other outer structure portion band and capacitively coupled thereto. An inner guard structure utilizes a pair of elliptical rings placed substantially in registration with the elliptical portions of the outer structure formed by the capacitively-coupled juxtaposed upper or lower wing portions. The resonator wings and band portions define a pair of complementary window, which may be placed upon either the regions of greatest or least curvature of the elliptical cross-sectional resonator. One of the guard rings is directly connected to system common potential while radio-frequency energy is coupled to one of the complementary outer section portions at an edge substantially at the midpoint of a band portion thereof. The eccentricity ratio of the elliptical cross-section of the resonator and the resonator dimensions are arranged to provide an interior volume into which a human head or body extremity can be placed and which human body portion fills the interior volume of the resonator to an extent such that the quality factor $Q_L$ of the resonator is reduced by about one order of magnitude with respect to the unloaded resonator quality factor.

In presently preferred embodiments, for $^1$H and $^{19}$F imaging at about 64 megacycles and about 60 MHz., respectively, in a 1.5 Tesla static imaging field, elliptical eccentricity ratios of about 1.3:1 are utilized.

Accordingly, it is one object of the present invention to provide a novel slotted-tube radio-frequency resonator having an elliptical cross-section for use in a nuclear magnetic resonance imaging system.

This and other objects of the present invention will become apparent upon reading of the following detailed description, when read in conjunction with the drawings.

BRIEF DESCRIPTION OF THE DRAWINGS

FIG. 3b is a graph of the impedance versus frequency of the tuned resonator of FIG. 3a;

DETAILED DESCRIPTION OF THE INVENTION

Referring initially to FIGS. 1 and 1a-1c, a first presently preferred embodiment 10 of our novel elliptical cross-section slotted-tube radio-frequency resonator for nuclear magnetic resonance imaging is illustrated. The resonator has a central axis $10a$; the resonator is normally positioned with the NMR static field parallel to axis $10a$. Resonator 10 comprises first and second outer structure portions 11-1 and 11-2 formed about an inner structure comprised of a lower guard ring $12a$ and an upper guard ring $12b$. The guard rings are continuous conductors of substantially identical shape, but spaced from one another in the direction of the central axis $10a$ of the resonator. A guard ring feed terminal 12-0 is connected to that edge of lower guard ring $12a$ furthest from upper guard ring $12b$, at a position thereon underlying a resonator outer structure feed point 11-0. A dielectric member 14 is interposed between at least each of lower and upper guard rings $12a$ and $12b$ and the overlying portions of outer structure portions 11-1 and 11-2. Advantageously, the dielectric member 14 is a one-piece member having an elliptical cross-section in planes substantially orthogonal to the direction of resonator central axis $10-a$, and extends from at least the lower edge of lower guard ring $12a$ to the upper edge of upper guard ring $12b$; the presence of the insulative material of member 14 in a pair of window areas $10w$-1 and $10w$-2, devoid of any portion of outer structure 11 or inner structure 12, does not substantially affect the radio-frequency operation of the resonator, yet provides additional structural integrity thereto. Member 14 can be fabricated of any suitable material having a low loss factor at the frequency of use; plastic, glass or ceramic material can be used.

Each of outer structure portions 11-1 and 11-2 (best viewed in FIG. 1a) comprises an I-shaped electrode each having a relatively wide central band $11a$-1 or $11a$-2 which has wing portions extending to the right and left thereof at both the upper and lower central band side edges $11a$-$1a$ and $11a$-$1b$ or $11a$-$2a$ and $11a$-$2b$. Thus, extended from the respective lower right and left peripheral edges $11a$-$1a$ and $11a$-$1b$, respectively, of central band $11a$-1 are respective lower right wing portion $11w$-$1a$ and lower left wing portion $11w$-$1a'$ and extended from the upper portions of central band side edges $11a$-$1a$ and $11a$-$1b$, respectively are respective upper right wing portion $11w$-$1b$ and upper left wing portion $11w$-$1b'$. Similarly, lower left wing portion $11w$-$2a$ and lower right wing portion $11w$-$2a'$ respectively extend from the lower peripheries of second central band sides $11a$-$2a$ and $11a$-$2b$, respectively, while respective upper left wing portion $11w$-$2b$ and upper right wing portion $11w$-$2b'$ respectively extend from the respective upper sides of second central band $11a$-2. The outer structure feed portion 11-0 extends from the lower edge of first central band $11a$-1, substantially along a line midway between the side edges thereof (e.g. substantially at one of the points of maximum cross-section curvature). Each of outer structure portions 11-1 and 11-2 are advantageously fabricated from a flat sheet, typically having a thickness on the order of about 5 milli-inches (i.e. 0.005"), of a highly conductive material, such as copper and the like. Each outer structure section 11-1 and 11-2 may have a substantially rectangular central band section $11a$-1 and $11a$-2, and substantially rectangular wing sections $11w$-$1a$, $11w$-$1a'$, $11w$-$1b$ and $11w$-$1b'$ or $11w$-$2a$, $11w$-$2a'$, $11w$-$2b$ and $11w$-$2b'$. It is entirely within the scope of the present invention to have the central band sides $11a$-$1a$ and $11a$-$1b$ or $11a$-$2a$ and $11a$-$2b$ lie along straight lines either parallel to the resonator central axis $10a$ (as illustrated) or skewed at some angle thereto, or to deviate from a substantially straight edge, so as to be concave, convex or of more complex convoluted form with respect to a line joining the end points of the central band sides. Similarly, each of wing portions $11w$-$1a$, $11w$-$1a'$, $11w$-$2a$, $11w$-$2a'$, $11w$-$1b$, $11w$-$1b'$, $11w$-$2b$ and $11w$-$2b'$ are advantageously formed as rectangular extensions from the associated central band sides, but may have the upper and lower edges thereof formed, when the pair of outer structure electrodes 11-1 and 11-2 are bent to the desired elliptical cross-sectional shape, to be either in one of a number of parallel planes substantially orthogonal to the resonator central axis $10a$ or to be skewed therefrom; advantageously, each of outer structure portions 11-1 and 11-2 will be symmetrical about resonator axis $10a$ and complementary to the other outer structure portion. It is highly advantageous that the wing edges 16-$1a$, 16-$1a'$, 16-$1b$, 16-$1b'$, 16-$2a$, 16-$2a'$, 16-$2b$ and 16-$2b'$ are straight edges lying parallel to resonator axis $10a$ such that adjacent pair of edges (e.g. wing edge pairs 16-$1a$ and 16-$2a$, 16-$1a'$ and 16-$2a'$, 16-$1b$ and 16-$2b$, and 16-$1b'$ and 16-$2b'$) are parallel to one another but spaced apart over the wing edge lengths W thereof, to form associated outer structure wing gaps $11g$-1, $11g'$-1, $11g$-2 and $11g'$-2, respectively. Dependent upon the height H from the bottom to top edges of the outer structure portions 11-1 and 11-2, a pair of complementary windows are formed of height S, where S=H−2W. For the resonators of presently preferred embodiments, the distance of each of gaps 11g-1, 11g-2, 11g'-1 and 11g'-2 are on the order of one-eighth inch.

Figure 1:
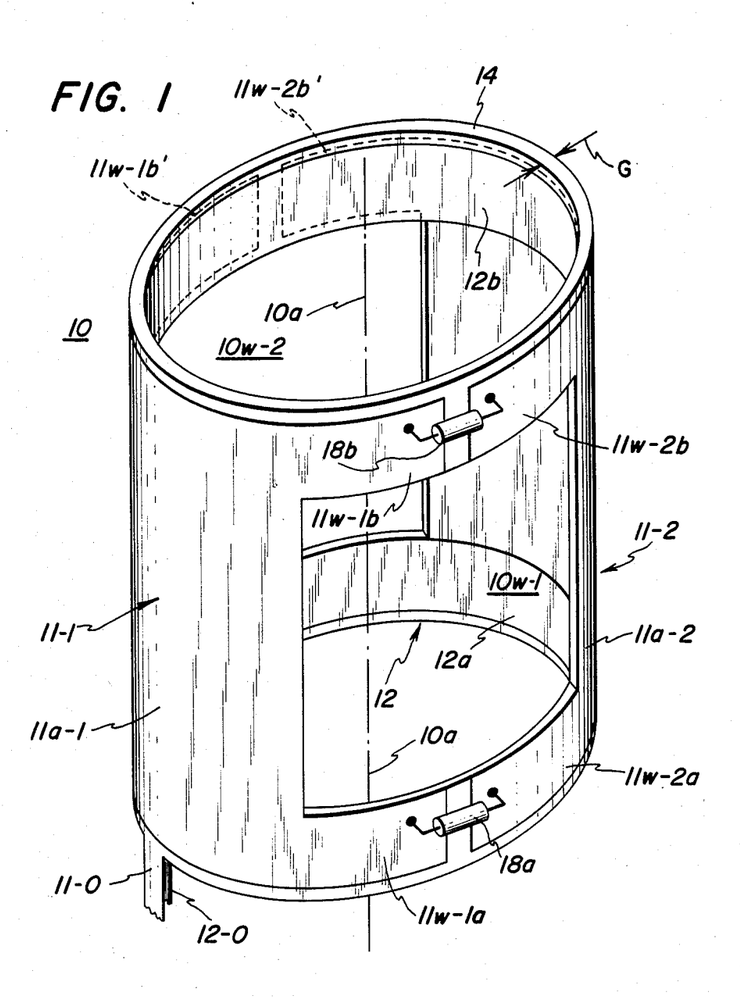
FIG. 1 is a perspective view of a first presently preferred embodiment of an elliptical cross-section, slotted-tube radio-frequency resonator for NMR imaging, in accordance with the principles of the present invention.
Figure 1A:
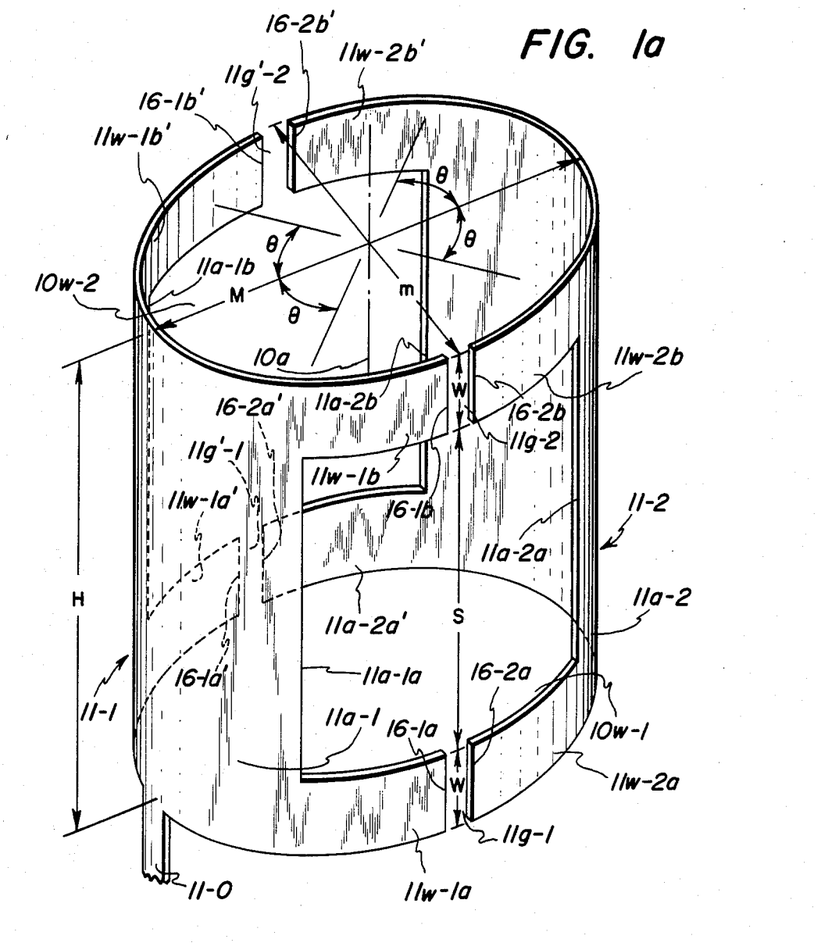
FIG. 1a is a perspective view of the outer portions of the resonator of FIG. 1, and useful in appreciating the various terms of resonator technology utilized herein.

Outer resonator structure portions 11-1 and 11-2 are, as previously mentioned hereinabove, formed into a tube having an ellipitcal cross-section, in planes substantially perpendicular to resonator central axis 10a. This geometry has a better fit to the cross-section of the body or head to be imaged and allows for a better coil-filling-factor, than does a round cross-section. The tube has a major axis M and a minor axis m, defining an eccentricity ratio e, where e=M/m; eccentricity ratio e is always greater than 1 (where e=1 defines a resonator of circular cross-section) and is preferredly in the range of 1.1–2.0, and more preferably in the range of 1.2–1.4. For any chosen eccentricity ratio, the central band portions 11a-1 and 11a-2 of the two outer structure portions 11-1 and 11-2, respectively, subtend angles θ to each side of the major axis M; advantageously, angle θ is in the range of 30°–50° and is most preferably about 40°. Thus, each of windows 10w-1 and 10w-2 subtend an angle of (180−2θ)°, e.g. about 100°, if θ is 40°. The principal useful RF magnetic field generated by the resonator is substantially directed parallel to an axis drawn through the centers of windows 10w-1 and 10w-2, i.e. in a direction perpendicular to the resonator axis 10a.

Figure 1B:
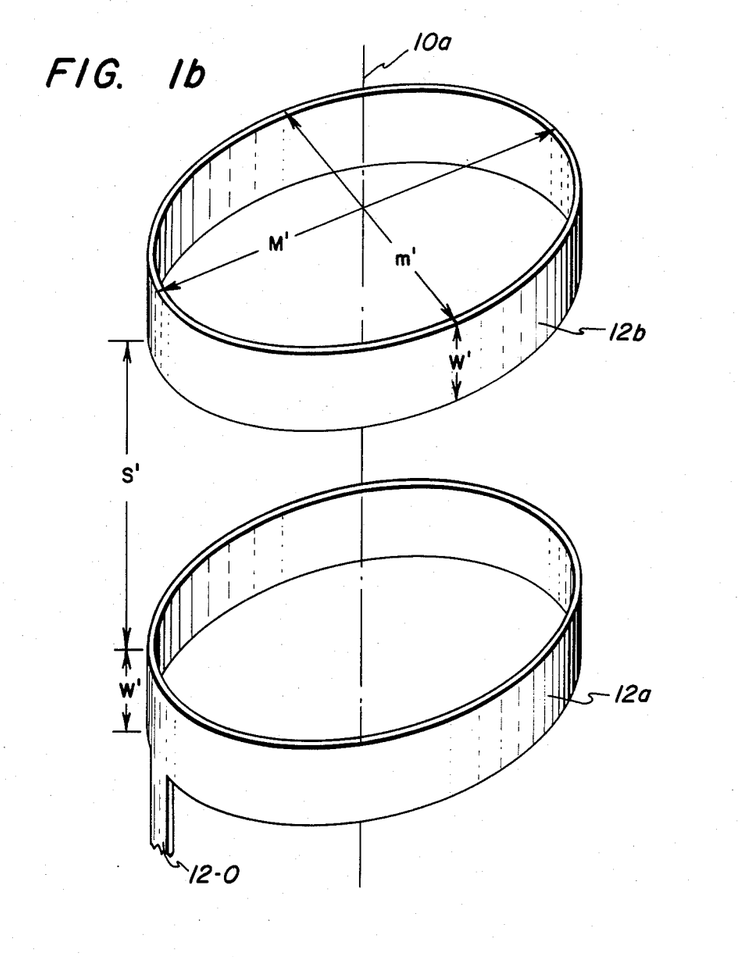
FIG. 1b is a perspective view of the inner guard ring structure of the resonator of FIG. 1.
Figure 1C:
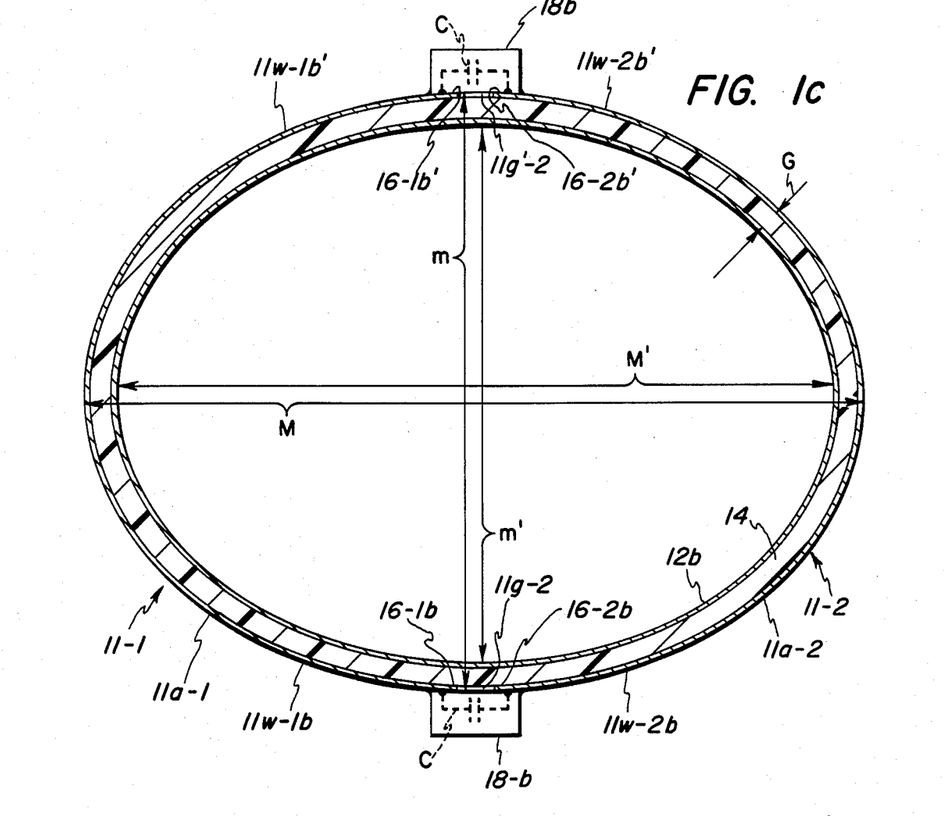
FIG. 1c is a top view of the resonator of FIG. 1, and particularly illustrating the capacitive coupling utilized between registered complementary wing end portions of the resonator outer structure.

Each of inner structure lower and upper guard rings 12a and 12b are also formed of a highly conductive material, e.g. copper and the like, typically as a band of a conductive foil, having a thickness on the order of 5 milli-inches, and attached to the interior surface of the elliptical cross-section dielectric member 14. A single strip of foil may be utilized to fabricate each of bands 12a or 12b, with the foil ends being joined together in essentially conductive manner to complete each of the elliptical guard rings. Each ring has a dimension W' which is substantially, though not necessarily exactly, equal to the dimension W of the overlying outer structure wing portions. The upper edge of lower guard ring 12a is separated from the lower edge of upper guard ring 12b by a spacing distance S', which is substantially equal to the window dimension S of the outer structure. Each elliptically cross-sectioned guard ring has a major axis M' of dimension slightly less than the dimension M of the major axis of the outer structure, by an amount substantially equal to twice the thickness G of dielectric member 14, and has a minor axis M' of dimension slightly less than the minor axis M of the outer structure, by an amount substantially equal to twice the thickness G of the interposed dielectric member 14. The dielectric member thickness G is chosen, typically in the range of about 1/32" to about ⅝", to tune the natural unloaded resonance of the resonator to a frequency about 10% higher than the desired NMR imaging frequency to be used.

Figure 1D:
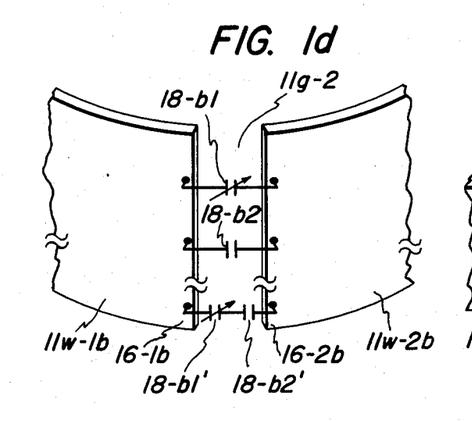
FIGS. 1d and 1e are portions of the complementary wing end structures, illustrating various means of capacitive coupling therebetween.

One of a plurality of capacitive coupling means 18, such as a fixed-capacitance chip capacitor and the like, is connected between the ends of adjacent wings. Thus, a first coupling capacitor 18a is connected between the ends of adjacent wings 11w-1a and 11w-2a and a second coupling capacitor 18b is connected between the ends of wings 11w-1b and 11w-2b. A third coupling capacitor 18b' is connected (FIG. 1c) between the ends of adjacent wings 11w-1b' and 11w-2b', across the gap 11g'-2 therebetween, while a fourth capacitive coupling element 18a' (not visible in the views of FIGS. 1 and 1a-1c) is connected between the ends of lower wings 11w-1a' and 11w-2a', across the gap 11g'-1 therebetween. Each of the four wing-gap capacitances, (selected to tune, in conjunction with the member 14 thickness G dimension, the resonator to resonance at or slightly above the desired NMR imaging frequency of operation) may be a fixed or variable type and should possess as high a quality Q factor as possible at the frequency of intended use. Each coupling capacitance 18 may be of any form desired, such as the fixed-value, tubular capacitances 18a and 18b shown in FIG. 1, the fixed-value chip capacitor structures 18b and 18b' shown in FIG. 1c or of suitable variable configuration, such as air, quartz, sapphire and the like dielectric variable trimmer capacitors, of piston or other types well known to the variable capacitor arts. To facilitate coarse and precise tuing of resonator 10 both to a desired degree of symmetrical or assymetrical RF field homogenity and to a resonant condition at a particular operating frequency determined by the particular imaging system with which the resonator is to be used, it is highly desirable to provide a variable capacitance at at least one of the four inter-wing gaps. The variable capacitance can take either of the forms shown in FIG. 1d; the total inter-wing coupling capacitance can be formed either by the parallel combination of a variable capacitance 18-b1 and a fixed capacitance 18-b2, where the total capacitance required is greater than the maximum capacitance of variable capacitor 18-b1 alone, or by the series connection of variable capacitor 18-b1' and fixed capacitor 18-b2', where the minimum capacitance required may be less than the minimum capacitance available from variable capacitor 18-b1' alone.

Figure 1E:
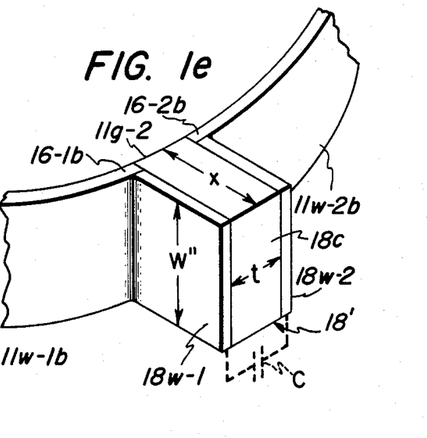

Most advantageously, we have found that a particularly rugged wing-gap tuning capacitance 18' can be fabricated as shown in FIG. 1e, by use of double-sided printed circuit board material. The printed circuit board material is cut into a strip of width W''', approximately equal to the dimension W of the wing ends (to avoid discontinuities at the interface between the wings and end-capacitor 18'), and with a length X somewhat greater than the length calculated to provide a capacitance, based on the capacitive plate area A ($A=X \times W'''$) and the dielectric constant of the printed circuit dielectric insulative substrate 18c sandwiched between the first and second conductors 18w-1 and 18w-2. The printed circuit board capacitor 18' is moved adjacent to wing ends 16-1b and 16-2b, between which the gap 11g-2 has been previously adjusted to equal the thickness T of the printed circuit capacitor dielectric thickness. The wing ends 16-1b and 16-2b are respectively joined to the abutting ends of circuit board conductor portions 18w-1 and 18w-2, as by soldering, welding and the like processes. Capacitor 18' is, advantageously, fabricated of a printed circuit board having a very low losstangent substrate 18c material, such as glass-Teflon R and the like, and with the subtrate 18c of a standard thickness, such as 1/32 inch, 1/16 inch and the like. Each printed circuit capacitor 18' can be tuned by trimming the length X thereof, by cutting, filing and the like processes, whereby the total equivalent capacitance C of each of the four capacitors 18 can be adjusted for the desired symmetry of the radio-frequency field within the resonator. The same adjustment of the four wing-gap bridging capacitances C can be effected by use of either method shown in FIG. 1d or by selection of the exact values of fixed value capacitance, if variable capacitance cannot, for some reason, be utilized.

By way of example only, in a nucelar magnetic resonance whole-body imaging system utilizing a 1.5 T superconducting magnet, an elliptical cross-section slotted-tube radio-frequency resonator 10 for body imaging has a major axis M' dimension of about 17 inches and a minor axis m dimension of about 13 inches, for an eccentricity ratio e of about 1.3, with a height H of about 21 inches, a wing end height W of about 4 inches and a window height S of 13 inches. Dielectric tube 14 may have a thickness G of between 1/32 inch and about ⅜ inch, whereby the inner guard ring major axis M' dimension is between about 15¾ inches and about 17 inches and the minor axis m' is between about 11¾ inches and about 13 inches, dependent upon the actual dielectric tube thickness G utilized and the thickness of the outer structure and inner guard ring electrodes. The inner guard ring height W' is also about 4 inches and the spacing S' therebetween is about 13 inches. This resonator is relatively easily tuned to the approximately 64 MHz. resonance frequency for $^1$H imaging at a field of 1.5 Tesla. For $^1$H or $^{19}$F head imaging in the same system, at an imaging frequency of about 64 or 60 MHz., respectively, an elliptical cross-section, slotted-tube radio-frequency resonator 10 was built utilizing a tube 14 of about 5/16 inch thickness G, with an outer structure major axis M dimension of about 11⅜ inches and minor axis m dimension of about 8¾ inches; the resonator height H is about 11¼ inches with wing height W and inner guard ring height W' of about 1¾ inches, a window height S and inner guard ring separation S' of about 7¾ inches and a window periphery, between complementary band portion edges 11a-1a and 11a-2a or 11a-1b and 11a-2b of about 8¼ inches. The precise NMR frequency desired is tuned using variable capacitors 18 across all four inter-wing gaps 11g-1, 11g'1, 11g-2 and 11g'-2. In fact, NMR frequencies in the complete range of about 20 MHz. to 75 MHz. are accessible using the variable wing-gap capacitors 18 alone, without requiring readjustment of the inner ring to outer electrode gap distance G.

Typically, resonator 10 provides an unloaded quality factor $Q_U$ of about 225 in the 60 MHz. range and a loaded quality factor $Q_L$ of about 25 when loaded by the insertion of a patient's head within the interior resonator volume. The ratio is loaded to unloaded Q is thus about one-ninth, assuring that the resonator provides significantly less noise/loss contribution than the body portion being imaged.

Figure 2:
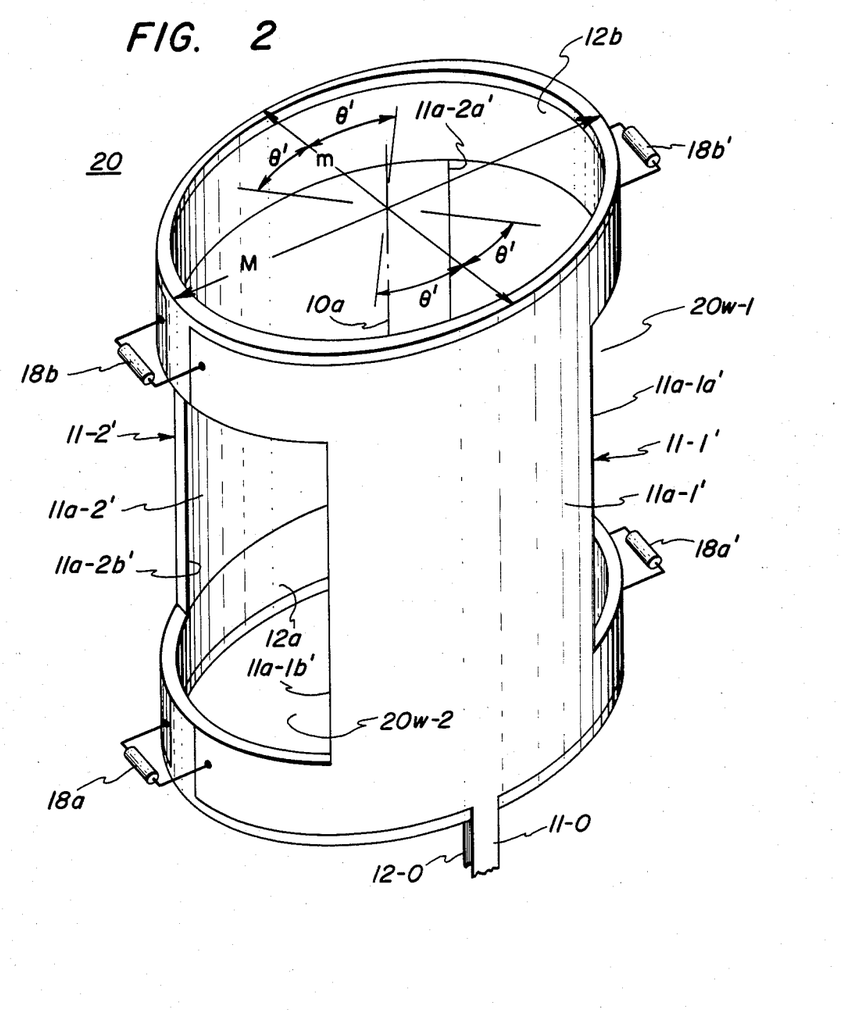
FIG. 2 is a perspective view of another presently preferred resonator embodiment, in which the outer structure band portions are arranged about the portions of minimal curvature and the resonator windows are arranged at portions of maximum resonator curvature.

In another presently preferred embodiment 20 of our novel elliptically cross-sectioned, slotted-tube radio-frequency resonator, the first and second outer vertical bands 11a-1' and 11a-2' of the respective first and second outer structure portions 11-1' and 11-2' are, as shown in FIG. 2, placed about the portion of least curvature of the elliptical cross-section, rather than about the greatest curvature ends of the resonator, as in the embodiment 10. In resonator 20, the angle θ' is formed between each of the central band edges 11a-1a', 11a-1b', 11a-2a' and 11a-2b', and the minor axis m, and is again preferably on the order of 40°. Embodiment 20 offers windows 20w-1 and 20w-2 of somewhat reduced area and may provide a somewhat reduced loaded quality factor $Q_L$, resulting in reduced resonator loss/noise contributions due to the greater optimization of filling factor obtained when a portion of a patient's body, such as the head, arm, leg and the like, fills the elliptical cross section of resonator 20, as opposed to the decrease in loaded quality factor $Q_L$ of resonator 10.

Figure 3A:
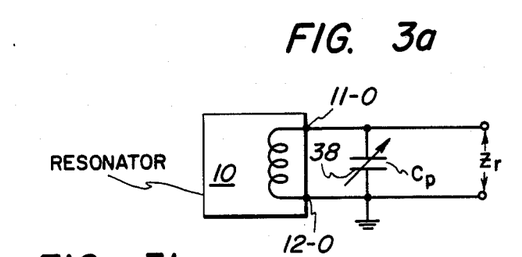
FIG. 3a is a circuit representation illustrating the tuning of the resonator of the present invention.
Figure 3B:
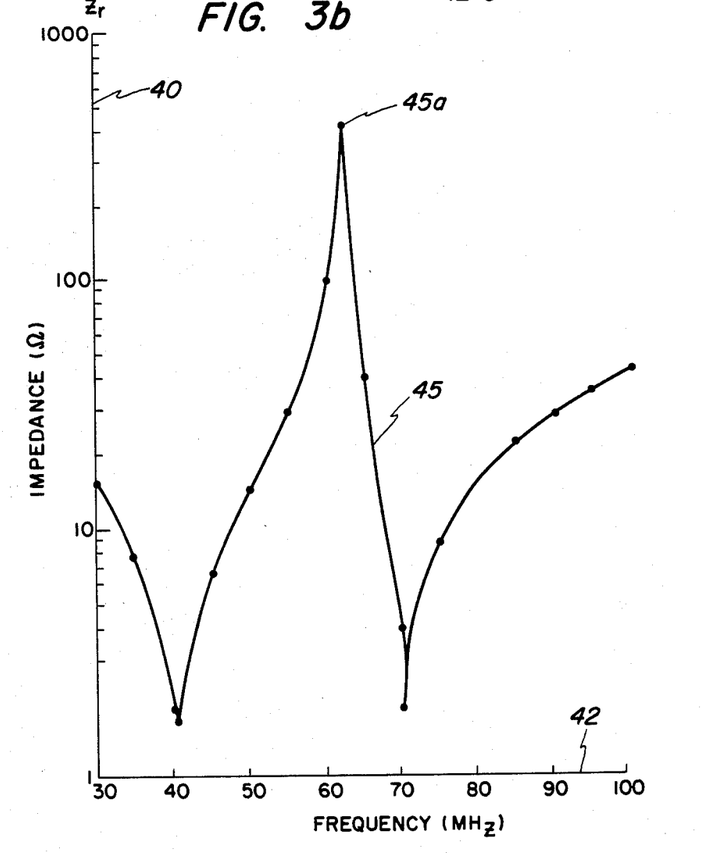

FIG. 3b illustrates the terminal impedance $Z_r$ of the resonator connected in the circuit of FIG. 3a, plotted along ordinate 40, for frequencies, plotted along abscissa 42, in the range from about 30 MHz. to about 100 MHz., for a $^1$H resonator at an unloaded resonant frequency of about 63 MHz. and tuned to resonance with an additional variable parallel capacitance $C_p$ of about 30 picofarad maximum value, shown in FIG. 3a. The extrema of curve 45, at about 41 MHz., 63 MHz. and 71 MHz., are natural resonant frequencies of the resonator structure, that is, each of these extrema corresponds to a frequency at which the reactive component of the resonator impedance $Z_r$ is zero. It will be seen that two of these extrema correspond to minima of the measured impedance $Z_e$, and a third extrema 45a corresponds to a maxima. Although it is possible to use the resonances corresponding to $Z_r$ minima for NMR applications, it is more desirable to use the high-impedance parallel-resonance point 45a, at which the impedance $Z_r$ is on the order of 400 ohms in this example, because the characteristic impedance of connecting cables is likely to be comparable to the values of $Z_r$ at the minima. In this instance, the connecting cables could therefore contribute a more significant proportion of noise to the detected NMR signal. We therefore preferentially use the high impedance resonance 45a, which parallel-resonance point is tuned to coincide with the NMR frequency. It has been found that, with a human head present inside this elliptically cross-sectioned slotted-tube resonator, the resonant resistance of about 400 ohms falls to a value on the order of 40 ohms, indicative of the resonator providing only about 12% of the total noise/loss contributions and the object-to-be-imaged, e.g. the human head, accounting for about 88% of the noise/loss contributions. Thus, the elliptically cross-sectional slotted-tube radio-frequency resonator of the present invention provides a minimal noise/loss contribution to the NMR imaging signal. This is particularly important in that a single radio-frequency resonator is normally utilized, with an external transmit/receive switch (not shown) for both excitation of the imaged sample and subsequent reception of the image return signal. Thus, the proportion of the excitation signal dissipated by the resonator is reduced, while the signal-to-noise ratio of the image return signal is maximized.

It will be seen that three factors are provided for tuning the resonator to the NMR frequency. Initially, a very course adjustment factor is provided by varying the distance G between the inner guard rings 12 and outer electrodes 11-1 and 11-2. We presently prefer to use a sufficiently large distance G that the particular resonator resonance frequency to be used (e.g. point 45a) is substantially above the desired NMR frequency (e.g. is at about 70–90 MHz. if it is desired to operate at about 63 MHz.), in the absence of any inter-wing gap capacitors 18. Since the capacitance between inner guard ring members 12 and outer electrode portions 11-1 and 11-2 is inversely proportional to distance G, the larger the value of distance G, the higher the natural resonator frequency obtained. As a second factor, the four inter-wing gap capacitors 18 are added between the wing portions of the outer electrodes. These gap capacitors are adjusted to lower the particular resonator resonance frequency substantially to, but not below, the NMR frequency. A final adjustment factor is provided by the parallel capacitance $C_p$ of input capacitor 38 (see FIG. 3a).

Figure 4A:
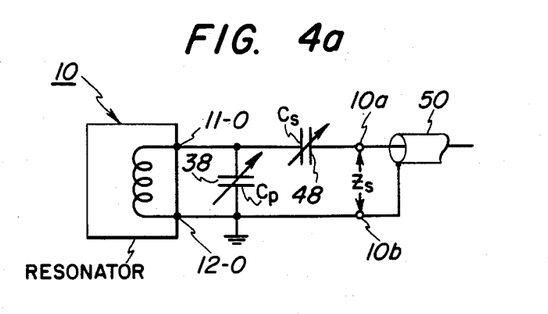
FIG. 4a is a circuit diagram illustrating the circuit for simultaneously tuning and matching of a resonator to a standard coaxial cable.

Because of the change in load resistance, as well as the change in resonant frequency, represented by the sample-loaded resonator with respect to the unloaded resonator, the total impedance must be adjusted for a low-reflectivity match to the system impedance, which is typically on the order of 50 ohms. The circuit of FIG. 4a schematically illustrates the final circuit utilized to match resonator 10 (or resonator 20 of FIG. 2) to the system impedance $Z_S$, between antenna terminals 10a and 10b. In addition to the parallel capacitance 38, of capacitor magnitude $C_p$ (also shown in FIG. 3a), a series tuning capacitance 48, of capacitive magnitude $C_S$, is connected between antenna feed terminal 10a and resonator feed terminal 11-0 and the associated terminal of capacitor 38. As is well known in the art, instrumentation (not shown) would be provided between antenna coaxial cable 50 and the antenna terminals 10a and 10b, to measure forward and reflected power and allow capacitors 38 and 48 to be adjusted for minimum reflected power at the desired frequency of operation, with a resonator loaded by the sample to be imaged. It should be understood that other forms of impedance adjustment and matching circuitry may be equally as well utilized and may contain inductive, in lieu of, or in addition to, capacitive elements.

Figure 4B:
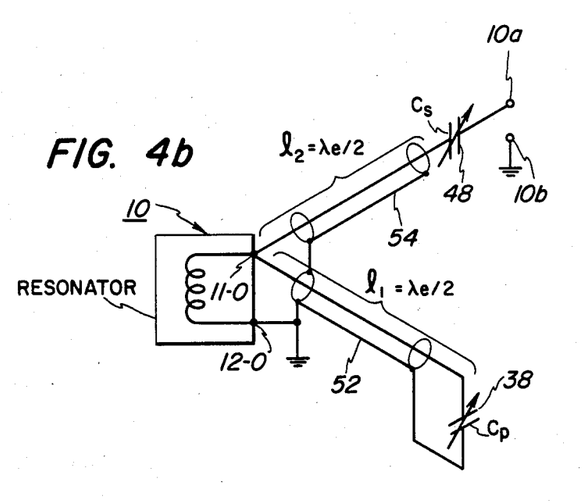
FIG. 4b is a schematic diagram illustrating a presently preferred configuration for achieving the circuit of FIG. 4a, with tuning and matching capacitances both remotely located from the resonator and having minimal effect thereon during capacitor adjustments.

Referring now to FIG. 4b, because it is often inconvenient to adjust the final tuning capacitance and matching circuit reactance at the resonator input terminals 11-0 and 12-10 with the NMR sample in place and the entire structure located within the main static field of the imaging magnet, it is desirable that imaging test personnel be spatially removed from the location of resonator 10 during the tuning procedure. In order to accomplish this spatial separation, yet have either the parallel capacitance 38 of the series capacitance 48 appear to be connected to resonator feed terminal 11-0, at the frequency of operation, either or both of capacitors 38 and/or 48 can be connected between resonator terminals 11-0 and 12-0 by associated cables 52 and/or 54, respectively. Advantageously, each of cables 52 and/or 54, if used, is a coaxial cable having a physical length $l_1$ or $l_2$ equal to one-half of an effective cable wavelength ($\lambda_e/2$) at the frequency of operation or equal to an integral multiple of one-half of an effective cable wavelength. It is well known to the art to calculate the effective wavelength of a particular cable, e.g. for a 50 ohm coaxial cable having an effective velocity of propagation of about 0.666, a one-half wavelength line at about 60 MHz. (i.e. a wavelength of about 5 meters) has a length l of about 65½" and allows the adjusting personnel to be positioned at a distance of almost 5½' from the loaded resonator. Since the length $l_1$ or $l_2$ of each of cables 52 and 54 can be increased in multiples of one-half wavelength and still have the value of capacitors 38 and 48 be the same as that required if the capacitor were connected directly to resonator terminal 11-0, capacitors 38 and 48 can easily be located outside of the imaging magnet bore and the loaded resonator can be adjusted in the exact location of use, compensating for substantially all loading elements.

While our novel elliptically cross-sectioned slotted-tube radio-frequency resonator for nuclear magnetic resonance imaging has been described with respect to several presently preferred embodiments thereof, many modifications and variations will now become apparent to those skilled in the art. It is our intent, therefore, to be limited only by the scope of the appending claims and not by the particular details and instrumentalities presented by way description of these presently preferred embodiments.

What we claim is:

1. A slotted-tube radio-frequency resonator, for magnetic resonance imaging at Larmor frequencies associated with a static magnetic field of magnitude greater than about 0.5 Tesla, comprising:
    first and second complementary outer structure portions, each having a generally I-shaped electrode having a central band with opposed ends and having one of four wing portions extending from each of a pair of opposed locations substantially at each opposed end thereof; each of said first and second complementary outer structure portions being disposed with the end of each of the four wing portions being spaced from a complementary adjacent one of the wing portions of the other outer structure portion and with both of said outer structure portion electrodes forming a tube having a substantially elliptical cross-section in planes substantially perpendicular to a central axis of said resonator;
    means for reactively coupling each of the wing portion ends to the complementary adjacent wing portion end;
    first and second guard ring members, each having an elliptical cross-section in a plane substantially perpendicular to the central axis of said resonator and each positioned inwardly of at least the adjacent wing portions at an associated one of the opposed ends of said bands;
    dielectric means for insulatively separating each of said first and second guard ring members from the overlying outer structure portions;
    means for applying a first potential to only one selected one of said first and second outer structure portion bands; and
    means for applying another potential to that one of said first and second guard ring members adjacent to said selected one of said bands.

2. The resonator of claim 1, wherein said dielectric completely fills the volume between each of said first and second guard ring members and the overlying portions of said outer structure portions.

3. The resonator of claim 2, wherein said dielectric has a thickness of between about 1/32" and about ⅝".

4. The resonator of claim 2, wherein said dielectric material forms a solid tube of elliptical cross-section, said tube having an interior surface upon which said first and second guard ring members are fabricated and having an exterior surface upon which said first and second outer structure portions are fabricated.

5. The resonator of claim 4, wherein said tube has a thickness of between about 1/32" and about ⅝".

6. The resonator of claim 1, wherein the reactive means comprises a capacitive element connected between each pair of adjacent wing portions.

7. The resonator of claim 6, wherein at least one of said capacitive elements is a variable capacitance.

8. The resonator of claim 6, wherein each wing portion has a substantially constant dimension at the end thereof closest to the adjacent complementary wing portion, and each capacitive element comprises: a pair of plates of substantially the same width as the width of said wing portion, each of said plates being joined to a different one of the complementary adjacent wing portions ends; and a member of a dielectric material having first and second opposed surfaces against which said first and second electrodes substantially abut.

9. The resonator of claim 1, wherein said coupling means and the separation provided by said dielectric means are coordinatingly adjusted to tune said resonator to a frequency in the range between about 20 MHz. and about 100 MHz.

10. The resonator of claim 1, wherein said first potential applying means comprises: means for coupling said first potential to a selected portion one of said outer structure portions at an edge of said central band and substantially symmetrically between the wing portions extended therefrom; and said another potential applying means comprises means for connecting said another potential to that portion of that one of said first and second guard ring members substantially adjacent to the location at which said first potential is connected to said outer structure portion band.

11. The resonator of claim 10, wherein said another potential is a common potential and said first potential applying means further includes: means for matching the resonant impedance of said resonator, at said selected point, to a predetermined impedance.

12. The resonator of claim 11, wherein said impedance-matching means comprises a first variable capacitance effectively series connected between said selected point and said predetermined impedance.

13. The resonator of claim 12, wherein said impedance-matching means further includes a second variable capacitance effectively parallel-connected between said selected point and said common potential.

14. The resonator of claim 13, wherein at least one of said first and second variable capacitances includes: a variable capacitor positioned at a location removed from said resonator; and at least one coaxial cable means for connecting said selected point to the associated one of said at least one variable capacitor, each coaxial cable means having an effective length of integer multiples of one-half wavelength at the frequency of operation of said resonator.

15. The resonator of claim 1, wherein each of said outer structure portions is positioned with the central band thereof substantially centered about the region of greatest curvature of the elliptical cross-section of said resonator.

16. The resonator of claim 1, wherein each of said outer structure portions is positioned with the central band thereof substantially centered about the region of least curvature of the elliptical cross-section of said resonator.

17. The resonator of claim 1, wherein said elliptical cross-section has an eccentricity ratio of the major axis to minor axis thereof in the range from about 1.1 to about 2.0.

18. The resonator of claim 17, wherein the eccentricity ratio of said resonator elliptical cross-section is in the range from about 1.2 to about 1.4.

19. The resonator of claim 17, wherein the minimum dimension between any two points on the interior surface of either one of said first or second guard ring members is greater than 8".

20. The resonator of claim 17, having an eccentricity ratio of about 1.3 and tunable to the magnetic resonance frequency of $^1H$ nuclei.

21. The resonator of claim 1, wherein the central band of each of said I-shaped outer structure portions subtends a total angle of substantially 80° relative to said central axis of said resonator.

* * * * *